United States Patent
Chang

(10) Patent No.: US 8,648,740 B2
(45) Date of Patent: Feb. 11, 2014

(54) TESTING APPARATUS AND METHOD FOR TESTING ANALOG-TO-DIGITAL CONVERTER

(75) Inventor: Hung-Sheng Chang, Hsinchu (TW)

(73) Assignee: Silicon Motion, Inc., Jhubei, Hsinchu County (TW)

( * ) Notice: Subject to any disclaimer, the term of this patent is extended or adjusted under 35 U.S.C. 154(b) by 0 days.

(21) Appl. No.: 13/525,505

(22) Filed: Jun. 18, 2012

(65) Prior Publication Data

US 2013/0154861 A1   Jun. 20, 2013

(30) Foreign Application Priority Data

Dec. 15, 2011  (TW) .............................. 100146406 A

(51) Int. Cl.
*H03M 1/10*   (2006.01)

(52) U.S. Cl.
USPC ........... 341/120; 341/118; 341/119; 341/121; 341/155; 341/164

(58) Field of Classification Search
USPC .................................. 341/118, 120, 155, 164
See application file for complete search history.

(56) References Cited

U.S. PATENT DOCUMENTS

| | | | | |
|---|---|---|---|---|
| 3,683,369 A * | 8/1972 | Stern | ............................. | 341/169 |
| 4,352,160 A * | 9/1982 | Frech et al. | .................... | 702/109 |
| 5,027,118 A * | 6/1991 | Nicolai | ......................... | 341/132 |
| 7,012,625 B1 * | 3/2006 | Kobayashi et al. | ........... | 345/690 |
| 7,068,199 B2 * | 6/2006 | Preisach | ........................ | 341/144 |
| 7,482,958 B2 * | 1/2009 | Tanaka et al. | .................. | 341/139 |
| 7,564,386 B2 * | 7/2009 | Barford | ......................... | 341/120 |
| 8,060,343 B2 * | 11/2011 | Sato | .............................. | 702/191 |
| 2004/0217895 A1 * | 11/2004 | Koyanagi | ...................... | 341/161 |
| 2007/0026835 A1 * | 2/2007 | Yamaji et al. | ................. | 455/318 |
| 2008/0291073 A1 * | 11/2008 | Iwata | ............................ | 341/159 |

* cited by examiner

*Primary Examiner* — Linh Nguyen

(74) *Attorney, Agent, or Firm* — McClure, Qualey & Rodack, LLP

(57) ABSTRACT

The invention provides a testing apparatus. In one embodiment, the testing apparatus receives a plurality of bit signals output by an analog-to-digital converter, and comprises a plurality of frequency counters and a comparison module. The frequency counters respectively calculate a plurality of transition frequencies of the values of the bit signals. The comparison module respectively compares the transition frequencies with a plurality of ideal transition frequencies to obtain a plurality of error frequencies. The performance analysis module estimates a performance value of the analog-to-digital converter according to the error frequencies.

18 Claims, 8 Drawing Sheets

| | Bit 9 | Bit 8 | Bit 7 | Bit 6 | Bit 5 | Bit 4 | Bit 3 | Bit 2 | Bit 1 | Bit 0 | Decimal value |
|---|---|---|---|---|---|---|---|---|---|---|---|
| Sample index 1 | 0 | 0 | 0 | 0 | 0 | 0 | 0 | 0 | 0 | 0 | 0 |
| Sample index 2 | 0 | 0 | 0 | 0 | 0 | 0 | 0 | 0 | 0 | 1 | 1 |
| Sample index 3 | 0 | 0 | 0 | 0 | 0 | 0 | 0 | 0 | 1 | 0 | 2 |
| Sample index 4 | 0 | 0 | 0 | 0 | 0 | 0 | 0 | 0 | 1 | 1 | 3 |
| Sample index 5 | 0 | 0 | 0 | 0 | 0 | 0 | 0 | 1 | 0 | 0 | 4 |
| Sample index 6 | 0 | 0 | 0 | 0 | 0 | 0 | 0 | 1 | 0 | 1 | 5 |
| Sample index 7 | 0 | 0 | 0 | 0 | 0 | 0 | 0 | 1 | 1 | 0 | 6 |
| Sample index 8 | 0 | 0 | 0 | 0 | 0 | 0 | 0 | 1 | 1 | 1 | 7 |
| Sample index 9 | 0 | 0 | 0 | 0 | 0 | 0 | 1 | 0 | 0 | 0 | 8 |
| Sample index 10 | 0 | 0 | 0 | 0 | 0 | 0 | 1 | 0 | 0 | 1 | 9 |
| Sample index 11 | 0 | 0 | 0 | 0 | 0 | 0 | 1 | 0 | 1 | 0 | 10 |
| Sample index 12 | 0 | 0 | 0 | 0 | 0 | 0 | 1 | 0 | 1 | 1 | 11 |
| Sample index 13 | 0 | 0 | 0 | 0 | 0 | 0 | 1 | 1 | 0 | 0 | 12 |
| Sample index 14 | 0 | 0 | 0 | 0 | 0 | 0 | 1 | 1 | 0 | 1 | 13 |
| Sample index 15 | 0 | 0 | 0 | 0 | 0 | 0 | 1 | 1 | 1 | 0 | 14 |
| Sample index 16 | 0 | 0 | 0 | 0 | 0 | 0 | 1 | 1 | 1 | 1 | 15 |
| | 0 | 0 | 0 | 0 | 0 | 0 | 0 | 3 | 7 | 15 | |

Transition frequency 9, Transition frequency 8, Transition frequency 7, Transition frequency 6, Transition frequency 5, Transition frequency 4, Transition frequency 3, Transition frequency 2, Transition frequency 1, Transition frequency 0

FIG. 5

|  | Bit 9 | | | | | | | | | Bit 0 | Decimal value |
|---|---|---|---|---|---|---|---|---|---|---|---|
| Sample index 1 | 0 | 0 | 0 | 1 | 0 | 1 | 1 | 0 | 0 | 1 | 89 |
| | 0 | 0 | 0 | 1 | 0 | 1 | 1 | 0 | 1 | 0 | 90 |
| | 0 | 0 | 0 | 1 | 0 | 1 | 1 | 0 | 1 | 1 | 91 |
| | 0 | 0 | 0 | 1 | 0 | 1 | 1 | 1 | 0 | 0 | 92 |
| | 0 | 0 | 0 | 1 | 0 | 1 | 1 | 1 | 0 | 1 | 93 |
| | 0 | 0 | 0 | 1 | 0 | 1 | 1 | 1 | 1 | 0 | 94 |
| | 0 | 0 | 0 | 1 | 0 | 1 | 1 | 1 | 1 | 1 | 95 |
| | 0 | 0 | 0 | 1 | 1 | 0 | 0 | 0 | 0 | 0 | 96 |
| | 0 | 0 | 0 | 1 | 1 | 0 | 0 | 0 | 0 | 1 | 97 |
| | 0 | 0 | 0 | 1 | 1 | 0 | 0 | 0 | 1 | 0 | 98 |
| | 0 | 0 | 0 | 1 | 1 | 0 | 0 | 0 | 1 | 1 | 99 |
| | 0 | 0 | 0 | 1 | 1 | 0 | 0 | 1 | 0 | 0 | 100 |
| | 0 | 0 | 0 | 1 | 1 | 0 | 0 | 1 | 0 | 1 | 101 |
| Sample index 14 | 0 | 0 | 0 | 1 | 1 | 0 | 0 | 1 | 1 | 0 | 102 |

FIG. 6A

| | Bit 9 | | | | | | | | | Bit 0 | Decimal value |
|---|---|---|---|---|---|---|---|---|---|---|---|
| Sample index 1 | 0 | 0 | 0 | 1 | 0 | 1 | 1 | 0 | 0 | 1 | 89 |
| | 0 | 0 | 0 | 1 | 0 | 1 | 1 | 0 | 0 | 1 | 89 |
| | 0 | 0 | 0 | 1 | 0 | 1 | 1 | 0 | 1 | 0 | 90 |
| | 0 | 0 | 0 | 1 | 0 | 1 | 1 | 0 | 1 | 0 | 90 |
| | 0 | 0 | 0 | 1 | 0 | 1 | 1 | 1 | 0 | 0 | 92 |
| | 0 | 0 | 0 | 1 | 0 | 1 | 1 | 1 | 0 | 0 | 92 |
| | 0 | 0 | 0 | 1 | 1 | 0 | 0 | 0 | 0 | 0 | 96 |
| | 0 | 0 | 0 | 1 | 0 | 1 | 1 | 1 | 1 | 1 | 95 |
| | 0 | 0 | 0 | 1 | 1 | 0 | 0 | 0 | 0 | 0 | 96 |
| | 0 | 0 | 0 | 1 | 1 | 0 | 0 | 0 | 0 | 0 | 96 |
| | 0 | 0 | 0 | 1 | 1 | 0 | 0 | 0 | 0 | 0 | 96 |
| | 0 | 0 | 0 | 1 | 0 | 1 | 1 | 1 | 1 | 0 | 94 |
| | 0 | 0 | 0 | 1 | 1 | 0 | 0 | 1 | 1 | 1 | 103 |
| Sample index 14 | 0 | 0 | 0 | 1 | 1 | 0 | 0 | 0 | 1 | 1 | 99 |

FIG. 6B

|  | Ideal value | Transition frequency | | | | |
|---|---|---|---|---|---|---|
|  |  | Ideal value (LPF3) | Ideal value (LPF4) | Real value | Real value (LPF4) |
| Bit 0 | 4091 | 4085 | 5 | 2393 | 583 |
| Bit 1 | 2044 | 2044 | 4 | 2471 | 563 |
| Bit 2 | 1020 | 1020 | 1020 | 1808 | 914 |
| Bit 3 | 508 | 508 | 508 | 938 | 508 |
| Bit 4 | 252 | 252 | 252 | 454 | 252 |
| Bit 5 | 124 | 124 | 124 | 230 | 124 |
| Bit 6 | 60 | 60 | 60 | 116 | 60 |
| Bit 7 | 28 | 28 | 28 | 58 | 28 |
| Bit 8 | 12 | 12 | 12 | 26 | 12 |
| Bit 9 | 4 | 4 | 4 | 12 | 4 |

TESTING APPARATUS AND METHOD FOR TESTING ANALOG-TO-DIGITAL CONVERTER

CROSS REFERENCE TO RELATED APPLICATIONS

This Application claims priority of Taiwan Patent Application No. 100146406, filed on Dec. 15, 2011, the entirety of which is incorporated by reference herein.

BACKGROUND OF THE INVENTION

1. Field of the Invention

The invention relates to analog-to-digital converters, and more particularly to testing of analog-to-digital converters.

2. Description of the Related Art

Analog-to-digital converters convert analog signals to digital signals. Because a digital signal processor can only receive a digital signal as an input, an analog-to-digital converter is often used to convert an analog signal to a digital signal for input of the digital signal processor. If the analog-to-digital signal is poor, errors are induced in the input signal of the digital signal processor, and performance of the digital signal processor is degraded. The evaluation of the performance of analog-to-digital converters is therefore important to weed out poor analog-to-digital converters.

Ordinarily, testing of analog-to-digital converters are performed during the manufacturing stage of the analog-to-digital converters. A testing apparatus is used to perform testing of analog-to-digital converters. Referring to FIG. 1, a block diagram of a testing apparatus 100 for testing an analog-to-digital converter 190 is shown. The analog-to-digital converter 190 receives an analog input signal and then converts the analog input signal to a plurality of bit signals bit0, bit1, ..., and bit9. The testing apparatus 100 then receives the bit signals and then gives a performance value to the analog-to-digital converter 190 according to the bit signals. In one embodiment, the testing apparatus 100 comprises a decimal converter 110, a histogram generator 120, and a performance analyzer 130.

The decimal converter 110 converts the binary bit signals bit0, bit1, bit2, ..., bit9 into a series of decimal values. The histogram generator 120 then generates a histogram according to the decimal values. The performance analyzer 130 then estimates an integral nonlinearity (INL) value and a differential nonlinearity (DNL) value according to the histogram to determine the performance of the analog-to-digital converter 190. FIG. 2A shows an analog input signal received by the analog-to-digital converter 190, and FIG. 2B shows a histogram generated by the histogram generator 120 according to the decimal values.

The testing apparatus 100 shown in FIG. 1, however, has a high manufacturing cost and a complicated circuit design. First, to store the decimal values generated by the decimal converter 110, the histogram generator 120 must comprise a memory with a large memory space which increases the hardware cost of the testing apparatus 100. In addition, the histogram generator 120 and the performance analyzer 130 need complicated circuits to implement complex calculations, and this increases the hardware cost of the testing apparatus 100. To reduce the hardware cost of the testing apparatus, a testing apparatus with a simplified circuit structure for testing an analog-to-digital converter is required.

BRIEF SUMMARY OF THE INVENTION

The invention provides a testing apparatus. In one embodiment, the testing apparatus receives a plurality of bit signals output by an analog-to-digital converter, and comprises a plurality of frequency counters and a comparison module. The frequency counters respectively calculate a plurality of transition frequencies of the values of the bit signals. The comparison module respectively compares the transition frequencies with a plurality of ideal transition frequencies to obtain a plurality of error frequencies. The performance analysis module estimates a performance value of the analog-to-digital converter according to the error frequencies.

The invention provides a method for testing an analog-to-digital converter. In one embodiment, a testing apparatus comprises a plurality of frequency counters, a comparison module, and a performance analysis module. First, a plurality of bit signals output by an analog-to-digital converter is received. A plurality of transition frequencies of the values of the bit signals are then calculated by the frequency counters. The transition frequencies are then compared with a plurality of ideal transition frequencies by the comparison module to obtain a plurality of error frequencies. A performance value of the analog-to-digital converter is then estimated by the performance analysis module according to the error frequencies.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 5 is a schematic diagram of an embodiment of a relationship between a plurality of bit signals and corresponding transition frequencies;

FIG. 6A is a schematic diagram of ideal values of a plurality of bit signals generated by an ideal analog-to-digital converter;

FIG. 6B is a schematic diagram of real values of a plurality of bit signals generated by a real analog-to-digital converter;

FIG. 7 is a schematic diagram of a relationship between ideal values and real values of transition frequencies of bit signals according to the invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
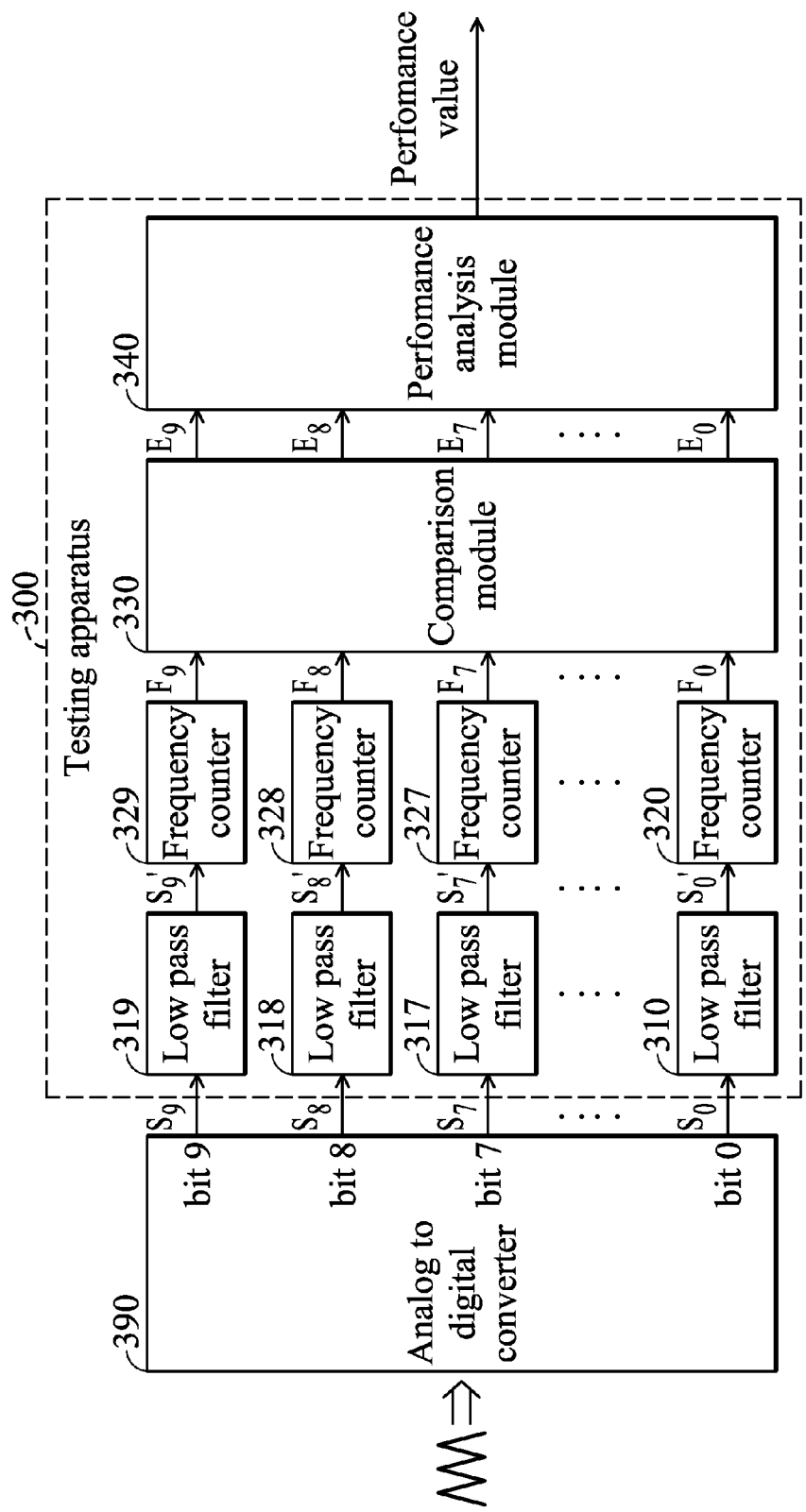
FIG. 3 is a block diagram of a testing apparatus for testing an analog-to-digital converter according to the invention.

Referring to FIG. 3, a block diagram of a testing apparatus 300 for testing an analog-to-digital converter 390 according to the invention is shown. The analog-to-digital converter 390 receives an analog input signal and converts the analog input signal to a plurality of bit signals $S_0, \ldots, S_7, S_8$, and $S_9$. The bit signals $S_0, \ldots, S_7, S_8$, and $S_9$ are bit values bit0, ..., bit7, bit8, bit9 generated by the analog-to-digital converter 390 by converting the analog input signal from analog to digital. In one embodiment, the analog input signal received by the analog-to-digital converter 390 is a triangle wave or a ramp wave.

The testing apparatus 300 receives a plurality of bit signals $S_0, \ldots, S_7, S_8$, and $S_9$ output by the analog-to-digital converter 390, and estimates a performance value of the analog-to-digital converter 390 according to the bit signals $S_0, \ldots, S_7, S_8$, and $S_9$. In one embodiment, the testing apparatus 300 comprises a plurality of low pass filters 310~319, a plurality of frequency counters 320~329, a comparison module 330, and a performance analysis module 340. The low pass filters 310~319 filter the bit signals $S_0, \ldots, S_7, S_8$, and $S_9$ output by the analog-to-digital converter 390 to generate a plurality of filtered bit signals $S_0', \ldots, S_7', S_8'$, and $S_9'$. In one embodiment, the low pass filters 310~319 respectively averages every three bits of the bit signals $S_0, \ldots, S_7, S_8$, and $S_9$ to obtain the filtered bit signals $S_0', \ldots, S_7', S_8'$, and $S_9'$. In another embodiment, the low pass filters 310~319 respectively averages every four bits of the bit signals $S_0', \ldots, S_7, S_8$, and $S_9$ to obtain the filtered bit signals $S_0', \ldots, S_7', S_8'$, and $S_9'$.

The frequency counters 320~329 respectively calculate transition frequencies of values of the filtered bit signals $S_0', \ldots, S_7', S_8'$, and $S_9'$ to obtain a plurality of transition frequencies $F_0, \ldots, F_7, F_8$, and $F_9$. In one embodiment, the frequency counters 320~329 respectively calculates a plurality of first total frequencies f1, ..., f7, f8, f9 of transitions from the value 0 to the value 1 of the filtered bit signals $S_0', \ldots, S_7', S_8'$, and $S_9'$, then calculates a plurality of second total frequencies f1', ..., f7', f8', f9' of transitions from the value 1 to the value 0 of the filtered bit signals $S_0', \ldots, S_7', S_8'$, and $S_9'$, and then respectively adds the second total frequencies to the first total frequencies to obtain the transition frequencies $F_0, \ldots, F_7, F_8$, and $F_9$.

The comparison module 330 receives the transition frequencies $F_0, \ldots, F_7, F_8$, and $F_9$ generated by the frequency counters 320~329. The comparison module 330 then compares the transition frequencies $F_0, \ldots, F_7, F_8$, and $F_9$ with ideal transition frequencies $F_0', \ldots, F_7', F_8'$, and $F_9'$ to obtain a plurality of error frequencies $E_0, \ldots, E_7, E_8$, and $E_9$. In one embodiment, the comparison module 330 subtracts the transition frequencies $F_0, \ldots, F_7, F_8$, and $F_9$ from the ideal transition frequencies $F_0', \ldots, F_7', F_8'$, and $F_9'$ to obtain the error frequencies $E_0, \ldots, E_7, E_8$, and $E_9$. The performance analysis module 340 then estimates a performance value of the analog-to-digital converter 390 according to the error frequencies $E_0, \ldots, E_7, E_8$, and $E_9$. In one embodiment, the performance analysis module 340 averages the error frequencies $E_0, \ldots, E_7, E_8$, and $E_9$ according to a weight to obtain the performance value. When the error frequencies $E_0, \ldots, E_7, E_8$, and $E_9$ are high, the performance value is high, and the performance value of the analog-to-digital converter 390 is low.

Figure 1:
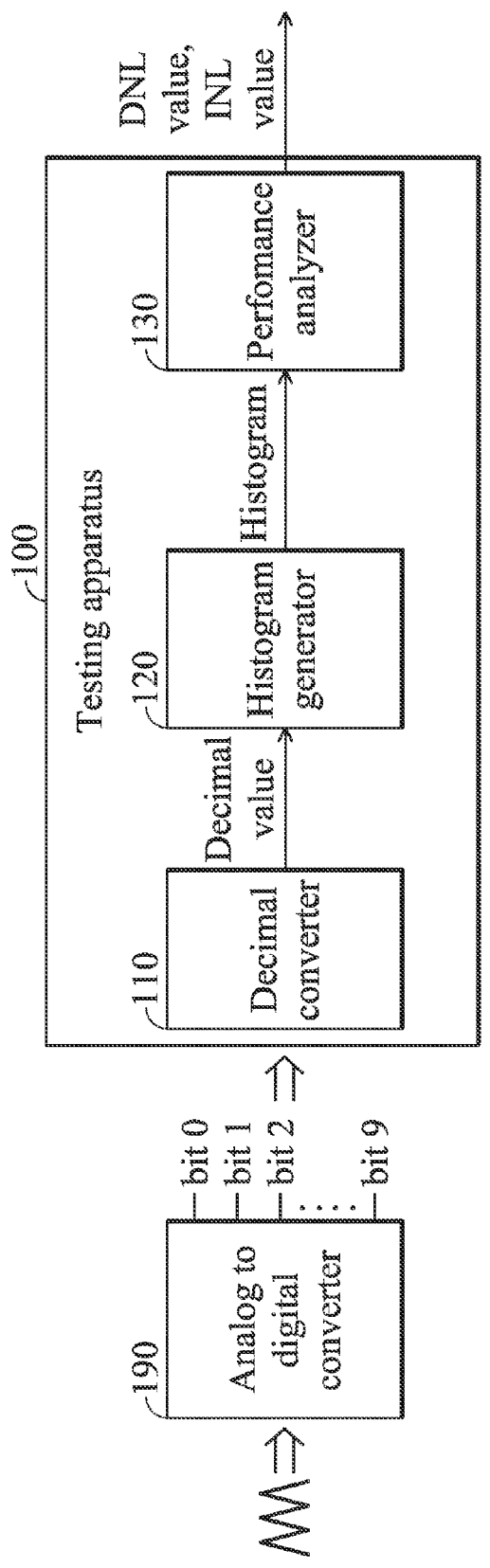
FIG. 1 is a block diagram of a conventional testing apparatus for testing an analog-to-digital converter.
Figure 2A:
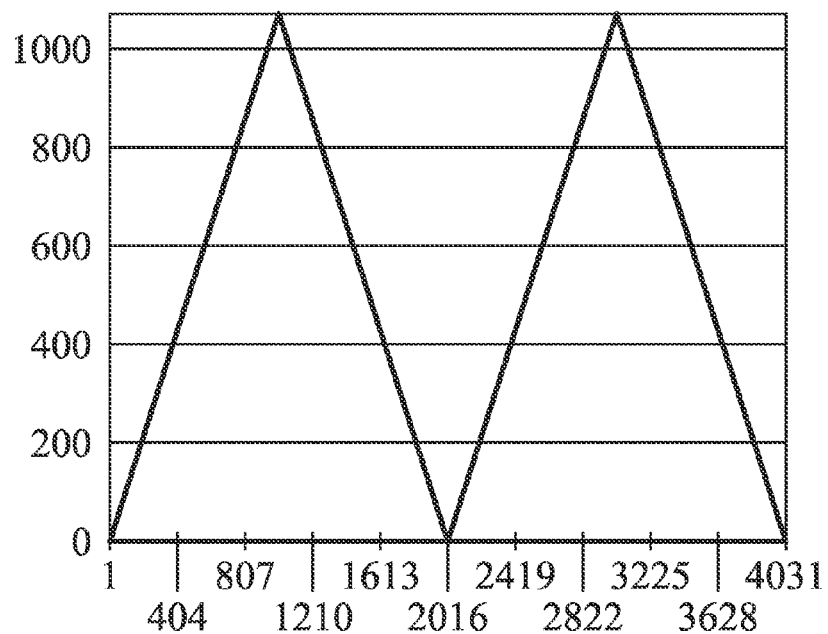
FIG. 2A shows an analog input signal received by an analog-to-digital converter.
Figure 2B:
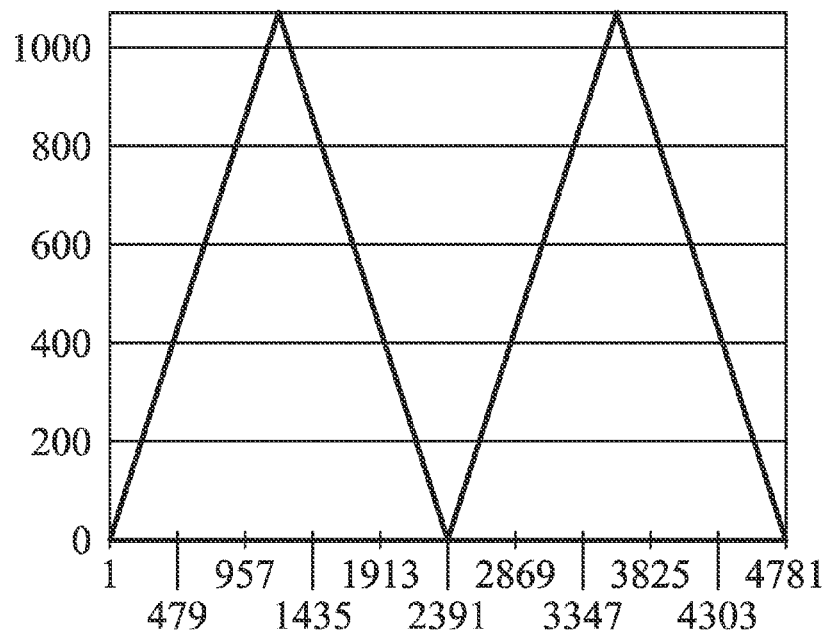
FIG. 2B shows a histogram generated by a histogram generator according to decimal values.

Because the testing apparatus 300 calculates the transition frequencies of the bit signals $S_0, \ldots, S_7, S_8$, and $S_9$ with the frequency counters 320~329 output by the analog-to-digital converter 390, and then estimates the performance of the analog-to-digital converter 390 according to the transition frequencies, the testing apparatus 300 does not require a memory with a large memory space for storing the values of bit signals $S_0, \ldots, S_7, S_8$, and $S_9$ as the conventional testing apparatus 100 shown in FIG. 1 does. The hardware cost of the testing apparatus 300 is therefore lower than that of the testing apparatus 100 shown in FIG. 1. In addition, the circuit design of the frequency counters 320~329, the comparison module 330, and the performance analysis module 340 is simple, and the hardware cost of the testing apparatus 300 is further reduced. The testing apparatus 300 therefore has a lower hardware cost than that of the testing apparatus 100 shown in FIG. 1.

Figure 4:
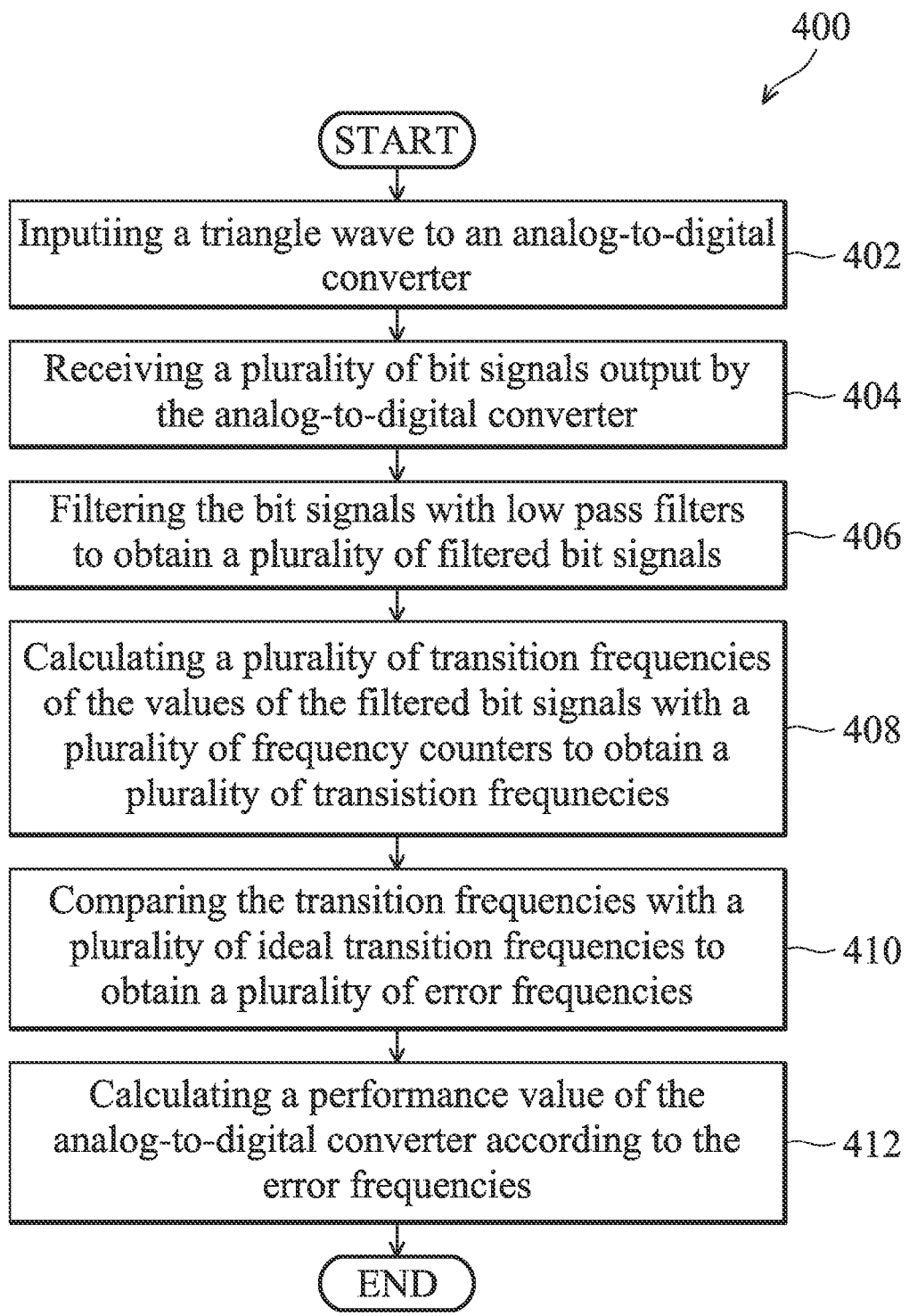
FIG. 4 is a flowchart of a method for testing an analog-to-digital converter according to the invention.

Referring to FIG. 4, a flowchart of a method 400 for testing an analog-to-digital converter according to the invention is shown. First, a triangle wave is sent to an analog-to-digital converter 390 as an input (step 402). The testing apparatus 300 then receives a plurality of bit signals $S_0, \ldots, S_7, S_8$, and $S_9$ output by the analog-to-digital converter 390 (step 404). The testing apparatus 300 then filters the bit signals $S_0, \ldots, S_7, S_8$, and $S_9$ with low pass filters 310~319 to obtain a plurality of filtered bit signals $S_0', \ldots, S_7', S_8'$, and $S_9'$ (step 406). The testing apparatus 300 then calculates a plurality of transition frequencies of the values of the filtered bit signals $S_0', \ldots, S_7', S_8'$, and $S_9'$ with a plurality of frequency counters 320~329 to obtain a plurality of transition frequencies $F_0, \ldots, F_7, F_8$, and $F_9$ (step 408). The comparison module 330 then compares the transition frequencies $F_0, \ldots, F_7, F_8$, and $F_9$ with a plurality of ideal transition frequencies to obtain a plurality of error frequencies $E_0, \ldots, E_7, E_8$, and $E_9$ (step 410). The performance analysis module 340 then calculates a performance value of the analog-to-digital converter 390 according to the error frequencies $E_0, \ldots, E_7, E_8$, and $E_9$ (step 412). In one embodiment, when any of the error frequencies which do not correspond to the three least significant bits are positive, the performance analysis module 340 determines the performance value of the analog-to-digital converter 390 to have failed to pass the threshold level.

Referring to FIG. 5, a schematic diagram of an embodiment of a relationship between a plurality of bit signals and corresponding transition frequencies is shown. Assume that the analog-to-digital converter 390 outputs 10 bit signals $S_o, \ldots, S_7, S_8$, and $S_9$ respectively corresponding to the bit0, ..., bit7, bit8, bit9 shown in FIG. 5, wherein the bit 0 is a least significant bit (LSB), and the bit 9 is a most significant bit (MSB). Assume that the testing apparatus 300 receives samples corresponding to 16 sample indexes from the analog-to-digital converter 390. For example, the samples corresponding to the time index 10 are (0, 0, 0, 0, 0, 0, 1, 0, 0, 1), and the samples corresponding to the time index 16 are (0, 0, 0, 0, 0, 0, 1, 1, 1, 1). The testing apparatus 100 shown in FIG. 1 converts the samples corresponding to the sample index 10 to a decimal value of 9, converts the samples corresponding to the time index 16 to a decimal value of 15, and then estimates a performance value of the analog-to-digital converter according to the decimal values. The testing apparatus 100 shown in FIG. 1 therefore has to store the decimal values in a memory, and the hardware cost of the testing apparatus 100 is therefore increased.

On the contrary, the testing apparatus 300 uses frequency counters 320~329 to calculate the transition frequencies of values of the bit signals bit0~bit9 from 0 to 1 or from 1 to 0. For example, the transition frequencies of the bit signals bit0, bit1, bit2, and bit3 are respectively 15, 7, 3, and 0. The testing apparatus 300 therefore does not need a memory to store the values of the bit signals, and the hardware cost of the testing apparatus 300 is lowered. For example, the value of the bit signal bit1 changes from 0 to 1 at the sample indexes 3, 7, 11, and 15, and the value of the bit signal bit1 changes from 1 to 0 at the sample indexes 5, 9, and 13, and the transition frequency corresponding to the bit signal bit1 is therefore 7. In addition, the value of the bit signal bit2 changes from 0 to 1 at the sample indexes 5 and 13, and the value of the bit signal bit2 changes from 1 to 0 at the sample index 9, and the transition frequency corresponding to the bit signal bit2 is therefore 3.

An ideal analog-to-digital converter does not generate noises and the bit signals generated by the ideal analog-to-digital converter have ideal values. Referring to FIG. 6A, a schematic diagram of ideal values of a plurality of bit signals generated by an ideal analog-to-digital converter is shown. The value corresponding to the least significant bit changes at each sample index, and the value corresponding to the most significant bit doesn't change during the sample indexes 1~14. The decimal values corresponding to the sample indexes therefore gradually increase. A real analog-to-digital converter generates noises and the bit signals generated by the real analog-to-digital converter comprise errors. Referring to FIG. 6B, a schematic diagram of real values of a plurality of bit signals generated by a real analog-to-digital converter is shown. The decimal values corresponding to the sample indexes do not regularly change due to errors induced by noises.

The errors comprised by the bit signals generated by the real analog-to-digital converter shown in FIG. 6B lead to errors in the transition frequencies $F_0$~$F_9$ generated by frequency counters 320~329. The low pass filters 310~319 therefore filter the bit signals $S_0$~$S_9$ to obtain filtered bit signals $S_0'$~$S_9'$. Referring to FIG. 7, a schematic diagram of a relationship between the ideal values and the real values of transition frequencies of bit signals according to the invention is shown. The ideal values of transition frequencies of bit signals $S_0$, $S_1$, $S_2$, ..., $S_9$ generated by an ideal analog-to-digital converter are respectively 4091, 2044, 1024, ..., 4, as shown in the first row of the table of FIG. 7. The ideal values of transition frequencies of filtered bit signals $S_0'$, $S_1'$, $S_2'$, ..., $S_9'$ generated by low pass filters by averaging every three bits of the bit signals are respectively 4085, 2044, 1024, ..., 4, as shown in the second row of the table of FIG. 7. The ideal values of transition frequencies of filtered bit signals $S_0'$, $S_1'$, $S_2'$, ..., $S_9'$ generated by low pass filters by averaging every four bits of the bit signals are respectively 5, 4, 1024, ..., 4, as shown in the third row of the table of FIG. 7.

The real values of transition frequencies of bit signals $S_0$, $S_1$, $S_2$, ..., $S_9$ generated by a real analog-to-digital converter are respectively 2393, 2471, 1808, ..., 12, as shown in the fourth row of the table of FIG. 7. The real values of transition frequencies of filtered bit signals $S_0'$, $S_1'$, $S_2'$, ..., $S_9'$ generated by low pass filters by averaging every four bits of the bit signals are respectively 583, 565, 914, ..., 4, as shown in the fifth row of the table of FIG. 7. As shown in FIG. 5, because the low pass filters 310—319 filter the bit signals $S_0$~$S_9$, the real values of the transition frequencies of the filtered bit signals $S_0'$ and $S_1'$ corresponding to the two least significant bits greatly differ from the ideal values, and cannot be used as a reference for calculation of the performance value of the analog-to-digital converter. The performance analysis module 340 therefore only estimates the performance value of the analog-to-digital converter 390 according to the error frequencies $E_9$~$E_3$ which does not correspond to the two least significant bits $S_0$ and $S_1$. For example, the real values of the error frequencies $E_0$, $E_1$, and $E_2$ corresponding to the least significant bits $S_0$, $S_1$, and $S_2$ differ from the ideal values. Thus, when the performance analysis module 340 finds that any of the error frequencies $E_3$~$E_9$ which does not correspond to the three least significant bits are positive, the performance analysis module 340 determines that the performance of the analog-to-digital converter 390 has failed to pass a threshold level.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A testing apparatus, receiving a plurality of bit signals output by an analog-to-digital converter, comprising:
   a plurality of frequency counters, respectively calculating a plurality of transition frequencies of the values of the bit signals;
   a comparison module, respectively comparing the transition frequencies with a plurality of ideal transition frequencies to obtain a plurality of error frequencies; and
   a performance analysis module, estimating a performance value of the analog-to-digital converter according to the error frequencies.

2. The testing apparatus as claimed in claim 1, wherein the analog-to-digital converter receives a triangle wave or a ramp wave, and converts the triangle wave or the ramp wave from analog to digital to generate the bit signals.

3. The testing apparatus as claimed in claim 1, wherein the combination of the plurality of bit values of the bit signals corresponding to a single sample index is a binary value of an input value of the analog-to-digital converter.

4. The testing apparatus as claimed in claim 1, wherein the frequency counters respectively calculates a plurality of first total frequencies of transitions from the value 0 to the value 1 of the bit signals, calculates a plurality of second total frequencies of transitions from the value 1 to the value 0 of the bit signals, and adds the second total frequencies to the first total frequencies to obtain the transition frequencies.

5. The testing apparatus as claimed in claim 1, wherein the testing apparatus further comprises:
   a plurality of low pass filters, respectively coupled between the analog-to-digital converter and one of the frequency counters, respectively filtering the bit signals to obtain a plurality of filtered bit signals, and then sending the filtered bit signals to the frequency counters as the inputs of the frequency counters.

6. The testing apparatus as claimed in claim 5, wherein the low pass filters average each three or four sample values of the bit signals to obtain the sample values of the filtered bit signals.

7. The testing apparatus as claimed in claim 1, wherein if any of the error frequencies which does not correspond to the three least significant bits are positive, the performance analysis module determines the performance value of the analog-to-digital converter to have failed to pass the threshold level.

8. The testing apparatus as claimed in claim 1, wherein the performance analysis module averages the error frequencies according to a predetermined weight to obtain the performance value, wherein a high performance value indicates low performance of the analog-to-digital converter.

9. The testing apparatus as claimed in claim 1, wherein the performance analysis module estimates the performance value according to the error frequencies which does not correspond to the two least significant bits.

10. A method for testing an analog-to-digital converter, comprising:
    receiving a plurality of bit signals output by an analog-to-digital converter;
    calculating a plurality of transition frequencies of the values of the bit signals with a plurality of frequency counters;

respectively comparing the transition frequencies with a plurality of ideal transition frequencies by a comparison module to obtain a plurality of error frequencies; and estimating a performance value of the analog-to-digital converter by a performance analysis module according to the error frequencies.

11. The method as claimed in claim 10, further comprising:

generating a triangle wave or a ramp wave as an input signal of the analog-to-digital converter;

wherein the analog-to-digital converter converts the triangle wave or the ramp wave from analog to digital to generate the bit signals.

12. The method as claimed in claim 10, wherein the combination of the plurality of bit values of the bit signals corresponding to a single sample index is a binary value of an input value of the analog-to-digital converter.

13. The method as claimed in claim 10, wherein calculation of the transition frequencies comprises:

respectively calculating a plurality of first total frequencies of transitions from the value 0 to the value 1 of the bit signals;

respectively calculating a plurality of second total frequencies of transitions from the value 1 to the value 0 of the bit signals; and adding the second total frequencies to the first total frequencies to obtain the transition frequencies.

14. The method as claimed in claim 10, wherein the method further comprises:

respectively filtering the bit signals by a plurality of low pass filters to obtain a plurality of filtered bit signals; and sending the filtered bit signals to the frequency counters as the inputs of the frequency counters.

15. The method as claimed in claim 14, wherein filtration of the bit signals comprises:

averaging each three or four sample values of the bit signals by the low pass filters to obtain the sample values of the filtered bit signals.

16. The method as claimed in claim 10, wherein estimation of the performance value comprises:

if any of the error frequencies which does not correspond to the three least significant bits are positive, determining the performance value of the analog-to-digital converter by the performance analysis module to have failed to pass the threshold level.

17. The method as claimed in claim 10, wherein estimation of the performance value comprises:

averaging the error frequencies according to a predetermined weight by the performance analysis module to obtain the performance value;

wherein a high performance value indicates low performance of the analog-to-digital converter.

18. The method as claimed in claim 10, wherein estimation of the performance value comprises:

estimating the performance value by the performance analysis module according to the error frequencies which does not correspond to the two least significant bits.

* * * * *